(12) United States Patent
Lammel et al.

(10) Patent No.: US 8,148,234 B2
(45) Date of Patent: Apr. 3, 2012

(54) METHOD FOR MANUFACTURING A SEMICONDUCTOR STRUCTURE, AND A CORRESPONDING SEMICONDUCTOR STRUCTURE

(75) Inventors: Gerhard Lammel, Tuebingen (DE); Hubert Benzel, Pliezhausen (DE); Matthias Illing, Palo Alto, CA (US); Franz Laermer, Weil der Stadt (DE); Silvia Kronmueller, Schwaikheim (DE); Paul Farber, Stuttgart (DE); Simon Armbruster, Gomaringen (DE); Ralf Reichenbach, Esslingen (DE); Christoph Schelling, Stuttgart (DE); Ando Feyh, Tamm (DE)

(73) Assignee: Robert Bosch GmbH, Stuttgart (DE)

( * ) Notice: Subject to any disclaimer, the term of this patent is extended or adjusted under 35 U.S.C. 154(b) by 297 days.

(21) Appl. No.: 12/282,842

(22) PCT Filed: Mar. 9, 2007

(86) PCT No.: PCT/EP2007/052227
§ 371 (c)(1),
(2), (4) Date: Mar. 2, 2009

(87) PCT Pub. No.: WO2007/107461
PCT Pub. Date: Sep. 27, 2007

(65) Prior Publication Data
US 2009/0236610 A1 Sep. 24, 2009

(30) Foreign Application Priority Data

Mar. 21, 2006 (DE) .......................... 10 2006 012 857

(51) Int. Cl.
*H01L 21/76* (2006.01)

(52) U.S. Cl. .... 438/409; 438/48; 438/486; 257/E33.018
(58) Field of Classification Search ............... 438/409, 438/906, 48, 486, 542; 257/E33.018
See application file for complete search history.

(56) References Cited

U.S. PATENT DOCUMENTS
4,262,295 A * 4/1981 Okano et al. .................. 257/589

FOREIGN PATENT DOCUMENTS
| DE | 4440390 A1 * | 5/1996 |
| DE | 100 32 579 | 1/2002 |
| DE | 10/2004 036 032 | 7/2005 |
| EP | 1 265 293 | 12/2002 |
| FR | 2 655 193 | 5/1991 |
| JP | 51 132974 | 11/1976 |

(Continued)

OTHER PUBLICATIONS

Kovalevskii A A et al: "Void Transformation and Dopant Distribution in Porous Silicon" Russian Microelectronics, vol. 36, No. 1, Feb. 2007, pp. 49-52, XP002432572 the whole document.

(Continued)

*Primary Examiner* — Kenneth Parker
*Assistant Examiner* — Jose R Diaz
(74) *Attorney, Agent, or Firm* — Kenyon & Kenyon LLP

(57) ABSTRACT

A method for manufacturing a semiconductor structure is provided which includes the following operations: supplying a crystalline semiconductor substrate, providing a porous region adjacent to a surface of the semiconductor substrate, introducing a dopant into the porous region from the surface, and thermally recrystallizing the porous region into a crystalline doping region of the semiconductor substrate whose doping type and/or doping concentration and/or doping distribution are/is different from those or that of the semiconductor substrate. A corresponding semiconductor structure is likewise provided.

12 Claims, 3 Drawing Sheets

FOREIGN PATENT DOCUMENTS

WO 97/40527 10/1997

OTHER PUBLICATIONS

Dehu P et al.: "P wells made of porous silicon for power devices: Determination of the formation steps" Thin Solid Films, Elsevier-Sequoia S.A. Lausanne, CH, vol. 255, No. 1/2., Jan. 15, 1995, pp. 321-324, XP004010569 ISSN: 0040-6090 the whole document.

Amato G et al.: "Deep "cold" junctions by porous silicon impregnation" Thin Solid Films, Elsevier-Sequoia S.A. Lausanne, CH, vol. 297, No. 1-2, Apr. 1, 1997, pp. 321-324 XP004126021, ISSN: 0040-6090, the whole document.

Astrova E V et al.: "Deep Diffusion Doping of Macroporous Silicon" Physica Status Solidi (A). Applied Research, Berlin, DE, vol. 182, No. 1, Nov. 16, 2000, pp. 145-150; XP009082971. ISSN: 0031-8965, the whole document.

Poponiak M R et al.: "Enhanced Diffusion in Porous Silicon" IBM Technical Disclosure Bulletin, IBM Corp. New York, US, vol. 17, No. 6, Nov. 1974, pp. 1598-1599, XP002046555, ISSN: 0018-8689, the whole document.

\* cited by examiner a)

b)

c)

METHOD FOR MANUFACTURING A SEMICONDUCTOR STRUCTURE, AND A CORRESPONDING SEMICONDUCTOR STRUCTURE

FIELD OF THE INVENTION

The present invention relates to a method for manufacturing a semiconductor structure, and a corresponding semiconductor structure.

BACKGROUND INFORMATION

In the broader sense, the present invention relates to a modification in the material properties of a semiconductor substrate made, for example, of silicon or silicon carbide, beginning from a surface of the semiconductor substrate. Modifications of this type may involve, for example, the setting of a certain conductivity or conductivity type (p or n doping).

Although it is applicable, in principle, to numerous other micromechanical or microelectronic semiconductor structures, the present invention and its underlying object are explained on the basis of micromechanical pressure sensors.

FIG. 3 shows a schematic cross-sectional view of a known semiconductor structure. In FIG. 3, reference numeral 1 designates a semiconductor substrate made of silicon, for example of the p-type, and reference numeral 5 designates a doping region on surface OF of semiconductor substrate 1, for example of the n-type, which has a depth t' of 10 µm.

Doping regions 5 of this type are usually achieved by diffusing foreign atoms into semiconductor substrate 1 from surface OF.

In the case of a silicon semiconductor substrate 1, a source of dopants is deposited for this purpose onto the wafer surface (e.g., phosphorus glass for n doping or boron glass for p doping) and subsequently thermally driven in at a high temperature, i.e., the dopants are excited for the purpose of diffusion into silicon substrate 1 from surface OF. Alternatively, the dopants are also implantable into the wafer surface in a layer having an original thickness of typically 1 µm to 2 µm, this layer being subsequently thermally diffused deeper into silicon semiconductor substrate 1.

Diffusion processes of this type are generally limited to a relatively thin layer thickness from surface OF of semiconductor substrate 1, since foreign substances such as dopant atoms diffuse only slowly into silicon, even at very high temperatures, and therefore in practice are able to achieve depths of only typically 20 µm to 25 µm in silicon, at least within economically justifiable diffusion times. Foreign atoms, such as antimony (Sb) or germanium (Ge), etc., exist which diffuse only extraordinarily slowly, due to their large atom diameter, so that not even the specified limit of typically 20 µm to 25 µm in silicon is achievable using these foreign atoms, but instead the diffusion depths within justifiable times remain substantially below this level.

In the case of silicon carbide, a complicating factor is that diffusion itself takes place extremely slowly even at very high temperatures of 1,400° C. The silicon carbide lattice is a substantial diffusion barrier, which greatly blocks a penetration of foreign atoms and limits diffusion processes to a penetration depth of just a few micrometers.

In micromechanical applications, in particular, however, thicker layers of, for example, silicon or silicon carbide having modified layer properties, for example a modified conductivity type, are frequently required, so that the aforementioned limits of thermal diffusion processes in the bulk material are problematic. Examples may include thick monocrystalline, n-type silicon layers having a thickness of, for example, 100 µm to 200 µm on a p-type semiconductor substrate, such as those advantageously used for high-pressure sensors in silicon in connection with an electrochemical etch stop from p-type to n-type silicon. This also applies to the manufacture of thick silicon bending beam structures using an electrochemical etch stop from the back and, in plasma trench techniques, from the front, as well as to the manufacture of thin silicon films having a thickness of 100 µm to 200 µm and desired doping by electrochemical etching or anodizing up to a p-n junction. The same applies to silicon carbide in the case of media-resistant, high-temperature-compatible sensors as well as the manufacture of silicon carbide films using known smart cut methods via doping-selective electrochemical anodizing or etching methods.

Methods for manufacturing porous regions in silicon semiconductor substrates are discussed in German patent documents DE 100 32 579 A1 and DE 10 2004 036 032 A1.

SUMMARY OF THE INVENTION

An object of the exemplary embodiments and/or exemplary methods of the present invention, therefore, is to provide a method for manufacturing a semiconductor structure and a corresponding semiconductor structure which, from the process-engineering point of view, enable simple manufacturing of deep doping regions in a semiconductor substrate.

The method according to the present invention for manufacturing a semiconductor structure according to the disclosure herein and the corresponding semiconductor structure according to further disclosure herein have the advantage that they enable the manufacture of thick layers of crystalline semiconductor material having modified properties by introducing foreign atoms or foreign substances. Alternatively, the layers may also be given a polycrystalline structure. On the one hand, modified layers may thus be manufactured in a thickness which would otherwise not be economical to manufacture in such a great layer thickness. On the other hand, foreign atoms are introducible which diffuse only very slowly and therefore may not be introduced in a practical manner into layers, for example antimony or germanium or other atoms having a large atom radius.

Modified layers may also be manufactured, for example in silicon carbide, where the diffusion-inhibiting base material SiC would otherwise make layer modification impossible or nearly impossible. It is therefore possible to modify materials in this manner across great layer thicknesses which would otherwise not be modifiable or dopable using methods according to the related art, due to their material properties.

In addition, the method described above may be used to achieve entirely new material properties by introducing large quantities of foreign atoms, which would otherwise not be introducible in such high doses.

The further disclosures herein describe advantageous refinements of and improvements on the particular subject matter of the exemplary embodiments and/or exemplary methods of the present invention.

An aspect of the exemplary embodiments and/or exemplary methods of the present invention is to create a porous region adjacent to a surface of a semiconductor substrate, in which a dopant may be introduced, after which the porous region is thermally recrystallized.

To provide the porous region, the method suitably uses electrochemical anodizing. For example, porous silicon or porous silicon carbide is nanoporously or mesoporously producible by selecting corresponding anodizing conditions, essentially current density and hydrofluoric acid concentration.

Using electrochemical anodizing, it is possible to unproblematically manufacture thick porous layers having a vertical dimension of, for example, 100 µm to 300 µm. This skeleton of nanoscale or mesoscale silicon or silicon carbide may subsequently be provided with foreign atoms in full thickness.

For this purpose, the dopants may be supplied in the form of a carrier gas (e.g., boroethane, arsine, phosphine, etc.), which penetrates the structure. Alternatively, a glass such as boron glass or phosphorus glass may be deposited on the surface or a precursor dissolved in liquid may be used to saturate the porous structure. Organic and anorganic compounds of boron, phosphorus (e.g., trimethylphosphite, phosphorus pentaxyde), arsenic (vinyl arsine), antimony, germanium (tetraethyl germanium), aluminum, iron, lead, etc., or their soluble salts (e.g., chlorides, iodides, bromides, etc.), which are soluble in liquids having a low surface tension, such as alcohols or water or alcohol/water mixtures or other organic solvents, may be used as the precursor. In an exemplary embodiment, the dopants are supplied in the form of a carrier gas, the gas homogeneously penetrating the porous region at a high temperature of, for example, 900° C., and the foreign atoms simultaneously diffusing from the gas phase into the nanostructure. In this exemplary embodiment, the thermal treatment for deposition and the thermal treatment for driving in the dopant occur at the same time.

It is particularly advantageous to dissolve doping atoms in supercritical $CO_2$, since this substance has no surface tension and therefore is able to particularly easily penetrate and functionalize nanostructures or mesostructures, i.e., coat them with foreign atoms. It may be suitable to add so-called co-solvents to supercritical $CO_2$ for the purpose of using solvatization to dissolve foreign substances which do not easily dissolve in $CO_2$. As mentioned above, the advantage of the supercritical state is the fact that every point in the depth of the porous material is effortlessly reachable, and the foreign substances may be transported and deposited everywhere in approximately the same concentration. In the exemplary embodiment, the porous region may be saturated using a solution of foreign atoms in a liquid, in particular in supercritical $CO_2$, at room temperature, whereupon a temperature step immediately takes place at 900° C. for driving in and a further temperature step at 950° C. for recrystallization and driving in.

The step for thermally driving in the foreign atoms may be carried out separately at a temperature at which structural rearrangement is not yet able to take place. At a temperature of, for example, 900° C., foreign atoms diffuse into the delicate nanostructures throughout the entire volume of the porous structure in silicon and penetrate these structures nearly homogeneously. The stability of the nanostructure is additionally supported by the fact that natural oxides on the structure surface additionally stabilize the latter and prevent thermal rearrangement. In the case of silicon, such oxides decay only at temperatures above 950° C. and, in the case of silicon carbide, only above 1,200° C.

In the recrystallization step, the porous region is thermally collapsed at high temperatures, for example above 950° C. in the case of silicon and above 1,200° C. in the case of silicon carbide, a solid monocrystalline layer in the sense of bulk material resulting by rearranging the silicon atoms or silicon carbide. Initially, this rearrangement was still undesirable for enabling the foreign atoms to reach all parts of the nanostructure and for avoiding damage to individual regions of the structure. At these elevated temperatures, the native oxide layers supporting the nanostructure are now evaporated, which may be additionally supported by adding hydrogen gas. Without the stabilization via the surface oxides, the thermal rearrangement of the structure may begin quickly and continue until the structure is completely compressed into a monocrystalline material. This makes it possible to have foreign atoms penetrate thick layers of silicon or silicon carbide in a controlled manner, in what is on the whole an economical overall process using electrochemical anodizing connection with one or more relatively short high-temperature steps.

Exemplary embodiments of the present invention are illustrated in the drawings and explained in greater detail in the following description.

DETAILED DESCRIPTION

Figure 1:
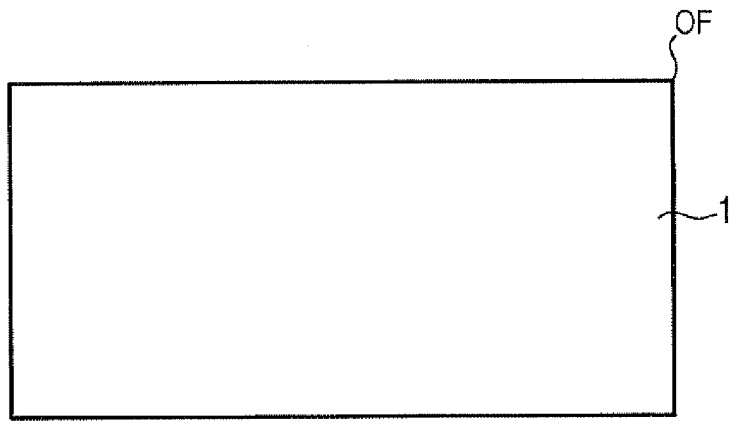
FIGS. 1a, 1b, 1c and 1d show schematic cross-sectional views of the essential manufacturing steps of a method for manufacturing a semiconductor structure according to a exemplary embodiment of the present invention.
Figure 1:
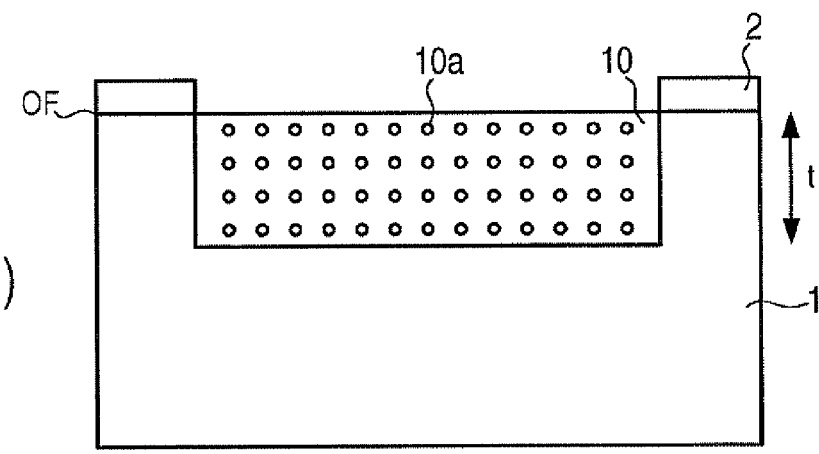
Figure 1:
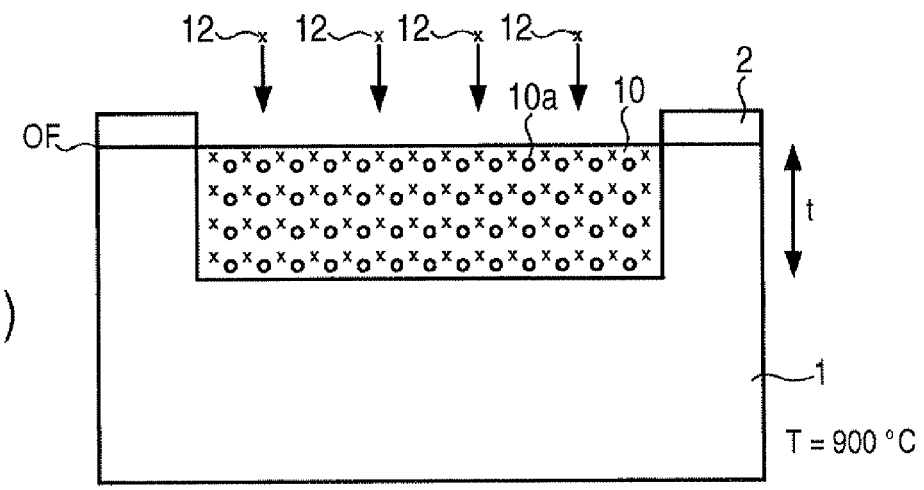
Figure 1:
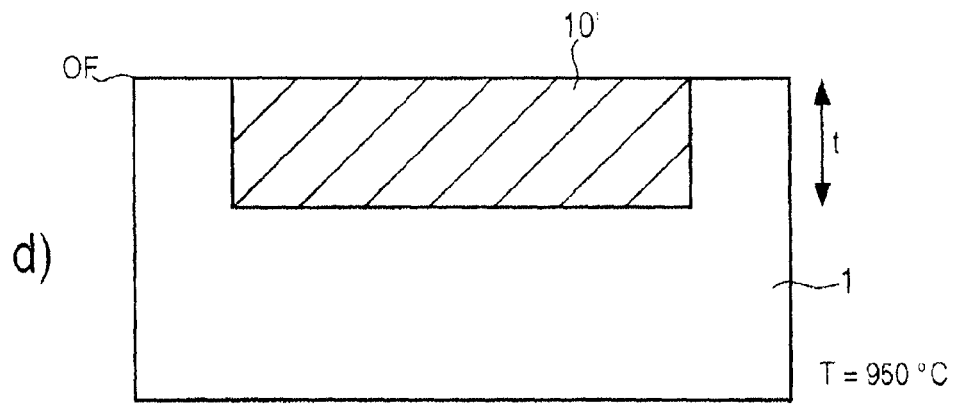

In the figures, the same reference numerals designate identical or functionally identical components.

Figure 2:
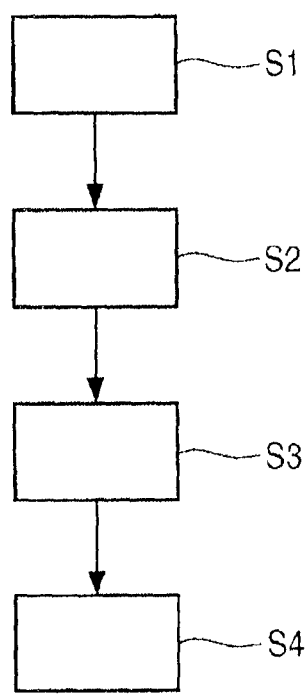
FIG. 2 shows a flow chart for explaining the sequence of the essential manufacturing steps of the method for manufacturing a semiconductor structure according to the exemplary embodiment of the present invention.
Figure 3:
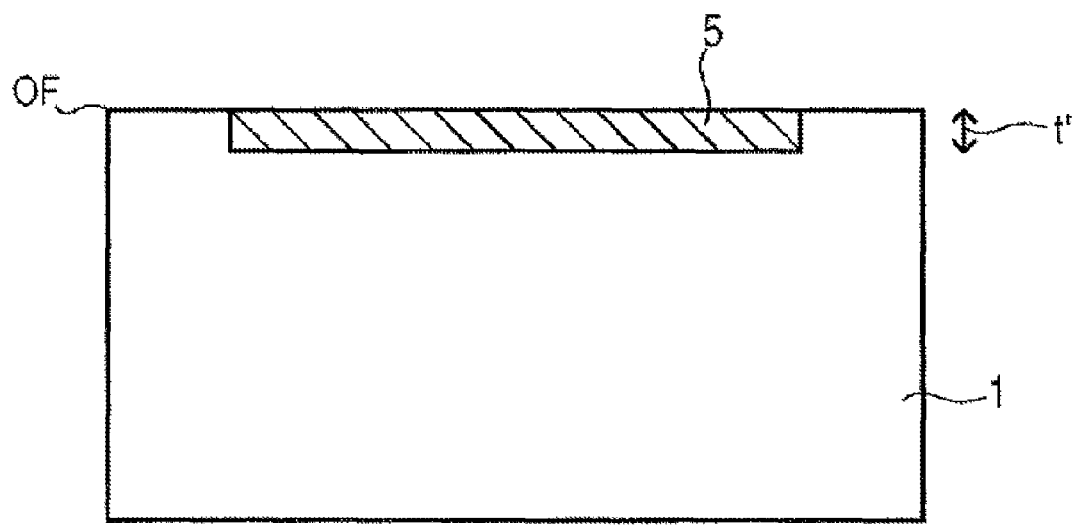
FIG. 3 shows a schematic cross-sectional view of a semiconductor structure from essential manufacturing operations of a method for manufacturing a semiconductor structure according to a specific embodiment of the present invention.

FIGS. 1a through d show schematic cross-sectional views of the essential manufacturing steps of a method for manufacturing a semiconductor structure according to a specific embodiment of the present invention, and FIG. 2 shows a flow chart for explaining the sequence of the essential manufacturing steps of the method for manufacturing a semiconductor structure according to the specific embodiment of the present invention.

In FIG. 1a, reference numeral 1 designates a silicon semiconductor substrate of the p type having a surface OF.

According to FIG. 1b, a mask 2 made of silicon nitride is applied to surface OF (Step S1), and a nanoporous region 10 having a depth t of 100 µm is subsequently introduced by electrochemical anodizing (Step S2), this region having a network of pores 10a which form an interconnected skeleton.

In a subsequent process step S3, which is illustrated in FIG. 1c, a glass 12, for example phosphorus glass, is first introduced into porous region 10 at a temperature of 900° C., a diffusion of the phosphorus into the skeleton made of nanoscale silicon simultaneously taking place directly at this temperature and the phosphorous thus homogeneously penetrating therein.

With reference to FIG. 1d, a temperature step S4 then takes place at a temperature of more than 950° C., rearrangement of the silicon atoms thus resulting in a thermal recrystallization of porous region 10 into a crystalline doping region 10' of semiconductor substrate 1, whose doping type, doping concentration and doping distribution are different from those of semiconductor substrate 1.

Although the exemplary embodiments and/or exemplary methods of the present invention was described on the basis of an exemplary embodiment, it is not limited thereto.

As an alternative to the above exemplary embodiment, the dopants may be introduced either in the form of a carrier gas or in the form of a liquid solution which penetrates the porous structure.

Although the semiconductor structure in the above example was formed using the mask made of silicon nitride, it is also possible to provide an edge doping in the semiconductor substrate which surrounds the region to be made porous on the sides and serves as an etch mask. A doping onto the back of the substrate may also be provided for the anodic process.

The application stated in the above example for a micromechanical pressure sensor is provided purely by way of example and may be modified in any manner.

What is claimed is:

1. A method for manufacturing a semiconductor structure, the method comprising:
   supplying a crystalline semiconductor substrate;
   providing a porous region adjacent to a surface of the semiconductor structure;
   introducing a dopant into the porous region from the surface;
   and thermally recrystallizing the porous region into a crystalline doping region of the semiconductor substrate, wherein at least one of a doping type, a doping concentration, and a doping distribution of the crystalline doping region is different from that of the semiconductor substrate.

2. The method of claim 1, wherein, one of during and after the introduction of the dopant, a first temperature operation is performed at a first temperature at which no structural transformation of the porous region occurs.

3. The method of claim 2, wherein, after the first temperature operation, a second temperature operation is performed immediately thereafter at a second temperature by increasing the temperature from the first temperature to the second temperature, at which a structural transformation of the porous region occurs, and which includes the thermal recrystallization into the crystalline doping region.

4. The method of claim 1, wherein the dopant is introduced into the porous region in the form of a carrier gas.

5. The method of claim 1, wherein the dopant is introduced into the porous region as a component of a glass.

6. The method of claim 1, wherein the dopant is introduced into the porous region dissolved in a liquid.

7. The method of claim 6, wherein the liquid includes supercritical $CO_2$.

8. The method of claim 6, wherein the liquid includes a co-solvent.

9. The method of claim 1, wherein the thermal recrystallization of the porous region is performed in a hydrogen atmosphere.

10. The method of claim 1, wherein the semiconductor substrate is made of at least one of silicon and silicon carbide.

11. The method of claim 1, wherein a depth of the crystalline doping region is at least 50 μm from the surface.

12. The method of claim 11, wherein the semiconductor substrate is made of at least one of silicon and silicon carbide.

* * * * *